(12) United States Patent
Raheja et al.

(10) Patent No.: US 11,955,900 B2
(45) Date of Patent: Apr. 9, 2024

(54) SOFT TURN-OFF FOR MOTOR CONTROLLERS

(71) Applicant: ABB Schweiz AG, Baden (CH)

(72) Inventors: Utkarsh Raheja, Raleigh, NC (US); Eddy Aeloiza, Apex, NC (US); Pietro Cairoli, Cary, NC (US)

(73) Assignee: ABB SCHWEIZ AG, Baden (CH)

( * ) Notice: Subject to any disclaimer, the term of this patent is extended or adjusted under 35 U.S.C. 154(b) by 472 days.

(21) Appl. No.: 17/363,802

(22) Filed: Jun. 30, 2021

(65) Prior Publication Data
US 2023/0006567 A1 Jan. 5, 2023

(51) Int. Cl.
*H02M 5/458* (2006.01)
*H02H 7/08* (2006.01)
*H02M 1/36* (2007.01)
*H02P 1/26* (2006.01)
*H03K 17/13* (2006.01)

(52) U.S. Cl.
CPC .......... *H02M 5/458* (2013.01); *H02H 7/0833* (2013.01); *H02M 1/36* (2013.01); *H02P 1/26* (2013.01); *H03K 17/133* (2013.01)

(58) Field of Classification Search
CPC .......... H02M 5/458; H02M 1/36; H02M 1/08; H02H 7/0833; H02P 1/26; H02P 1/02; H03K 17/133; H03K 17/6874
See application file for complete search history.

(56) References Cited

U.S. PATENT DOCUMENTS

| | | | |
|---|---|---|---|
| 5,559,402 A * | 9/1996 | Corrigan, III | H05B 44/00 315/226 |
| 7,196,435 B2 | 3/2007 | Kugelman et al. | |
| 7,196,436 B2 | 3/2007 | Kugleman | |
| 8,422,182 B2 * | 4/2013 | Boudet | H03K 17/6874 361/91.1 |
| 10,276,321 B2 | 4/2019 | Kennedy et al. | |

(Continued)

FOREIGN PATENT DOCUMENTS

| | | |
|---|---|---|
| DE | 4313882 C1 | 8/1994 |
| EP | 0118007 A2 | 9/1984 |

(Continued)

OTHER PUBLICATIONS

E. Haugan, H. Rygg, A. Skjellnes and L. Barstad, "Discrimination in Offshore and Marine DC Distribution Systems"; Siemens AS, Norway; 2016; 7 pages.

(Continued)

*Primary Examiner* — Yusef A Ahmed
(74) *Attorney, Agent, or Firm* — Greenberg Traurig, LLP

(57) ABSTRACT

A bi-directional switch for an inductive machine is described. The bi-directional switch may include a first power semiconductor transistor with a first source, a first drain, and a first gate. The bi-directional switch may further include a second power semiconductor transistor with a second source, a second drain, and a second gate. The bi-directional switch may include the second source connected to the first source. The bi-directional switch may include a soft-starter device including a control circuit configurable to provide a first control signal to the first power semiconductor transistor and a second control signal to the second power semiconductor transistor.

13 Claims, 10 Drawing Sheets

(56) References Cited

U.S. PATENT DOCUMENTS

| | | | |
|---|---|---|---|
| 10,516,372 B1* | 12/2019 | Effing | H03F 3/193 |
| 10,790,819 B1* | 9/2020 | Zhang | H03K 17/687 |
| 10,855,183 B1* | 12/2020 | Barrenscheen | H02M 3/33592 |
| 2003/0086280 A1* | 5/2003 | Bourdillon | H02M 3/33561 |
| | | | 363/21.12 |
| 2004/0212940 A1* | 10/2004 | Kugelman | H03K 17/785 |
| | | | 361/85 |
| 2004/0222701 A1* | 11/2004 | Kugelman | H02M 5/293 |
| | | | 307/131 |
| 2009/0302927 A1* | 12/2009 | Doffin | H03K 17/133 |
| | | | 327/434 |
| 2010/0277006 A1* | 11/2010 | Urciuoli | H01L 29/8083 |
| | | | 307/130 |
| 2011/0012424 A1* | 1/2011 | Wortberg | H02J 1/08 |
| | | | 307/9.1 |
| 2014/0347104 A1* | 11/2014 | Taylor | H01J 49/022 |
| | | | 327/124 |
| 2015/0341020 A1* | 11/2015 | Taylor | H03K 5/00006 |
| | | | 327/115 |
| 2018/0026570 A1* | 1/2018 | Cairoli | H02H 7/005 |
| | | | 307/112 |
| 2018/0026623 A1* | 1/2018 | Cairoli | H03K 17/136 |
| | | | 361/89 |
| 2019/0089146 A1* | 3/2019 | Li | H02H 7/0858 |
| 2019/0103742 A1 | 4/2019 | Kennedy et al. | |
| 2019/0305544 A1* | 10/2019 | Broze | H02H 7/0838 |
| 2020/0083880 A1* | 3/2020 | Takada | H03K 17/162 |
| 2020/0178372 A1* | 6/2020 | Benning | H05B 45/37 |
| 2020/0280311 A1* | 9/2020 | Morini | H02M 1/08 |
| 2020/0328730 A1* | 10/2020 | Augustoni | G05F 1/46 |
| 2020/0343809 A1* | 10/2020 | Beddingfield | H03K 17/164 |
| 2021/0391782 A1* | 12/2021 | Shi | H02M 7/4811 |
| 2022/0123745 A1* | 4/2022 | Cairoli | H03K 17/76 |
| 2022/0255416 A1* | 8/2022 | Lin | H02M 1/0064 |
| 2023/0090431 A1* | 3/2023 | Banin | H04L 7/0331 |
| | | | 375/295 |

FOREIGN PATENT DOCUMENTS

| | | |
|---|---|---|
| EP | 0197658 A2 | 10/1986 |
| EP | 0272898 A2 | 6/1988 |
| GB | 2294166 A | 4/1996 |
| KR | 101203883 B1 | 11/2012 |

OTHER PUBLICATIONS

K. Handt, G. Griepentrog, R. Maier, "Intelligent, Compact and Robust Semiconductor Circuit Breaker Based on Silicon Carbide Devices"; Siemens AG, Corporate Technology Power Electronics & Energy Management; Germany; 2008 IEEE; pp. 1586-1591.

R. R. Bordreaux, R.M. Nelms, "A Comparison of MOSFETs, IGBTs, and MCTs for Solid State Circuit Breakers"; Department of Electrical Engineering; Auburn University, Alabama; 1996; pp. 227-233.

Merchan-Villalba, et al.; "Four-Step Current Commutation Strategy for a Matrix Converter Based on Enhanced-PWM MCU Peripherals"; Electronics; 2019, 8, 547; 14 pages.

Extended European Search Report, issued by the European Patent Office, regarding corresponding patent application Serial No. EP 22181982.4; dated Nov. 7, 2022; 9 pages.

* cited by examiner

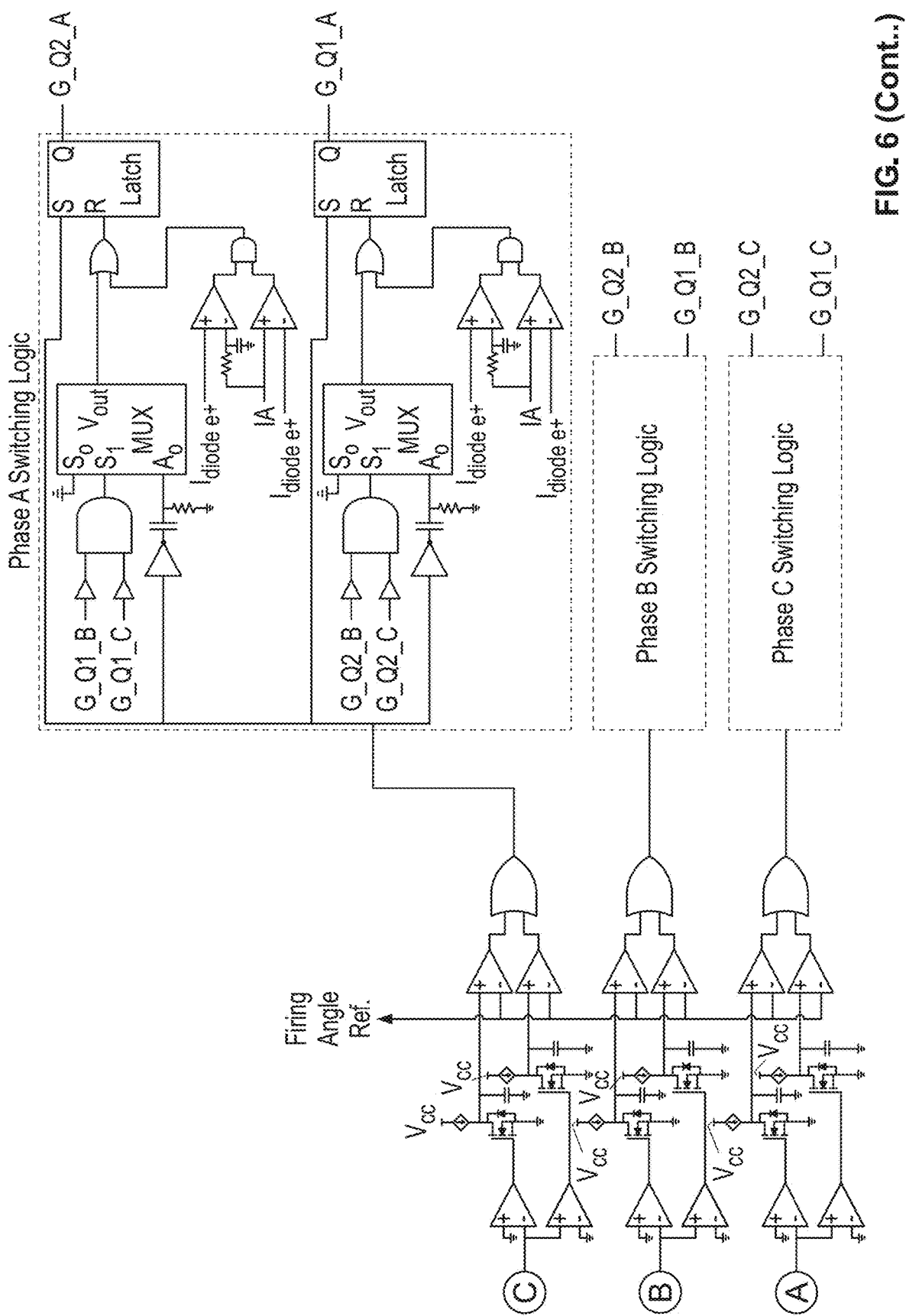
FIG. 6 (Cont...)

SOFT TURN-OFF FOR MOTOR CONTROLLERS

TECHNICAL FIELD

This disclosure relates generally to soft-starters for induction machines. More particularly, this disclosure relates to controlling a bi-directional switch using a controller and field effect transistors.

BACKGROUND

Soft-starters for induction machines generally use thyristors as a control switch. These types of devices are gated with a pulsed current at certain firing angles in the supply voltage half-cycle. These types of devices then naturally turn off at the next current zero-crossing in the absence of a gate-pulse. The firing angle is varied throughout the soft-start duration based on a defined control strategy to limit the starting current of the motor SUMMARY Any or all portion(s) of any of the embodiments disclosed herein may be combined with any other portion(s) of any embodiment.

In some embodiments of a bi-directional switch for an inductive machine, the bi-directional switch comprises a first field effect transistor (FET), wherein the first FET includes a first source, a first drain, and a first gate; a second FET, wherein the second FET includes a second source, a second drain, and a second gate; wherein the second source is connected to the first source; and a soft-starter device including a control circuit configurable to provide a first control signal to the first FET and a second control signal to the second FET.

In some embodiments of the bi-directional switch, the control circuit is configured to provide the first control signal and the second control signal such that the first FET and the second FET provide a plurality of modes of operation.

In some embodiments of the bi-directional switch, the plurality of modes comprises a first mode, wherein the first mode provides bi-directional conduction of current; a second mode, wherein the second mode provides uni-directional conduction of current in a first direction; a third mode, wherein the third mode that provides uni-directional conduction of current in a second direction; and a fourth mode, wherein the fourth mode provides bi-directional blocking of conduction of current.

In some embodiments of the bi-directional switch, the plurality of modes further comprises the first mode characterized by the control circuit providing both the first FET and the second FET with an enable control signal; the second mode characterized by the control circuit providing the first FET with an enable control signal and providing the second FET with a disable control signal; a third mode characterized by the control circuit providing the first FET with a disable control signal and providing the second FET with an enable control signal; and a fourth mode characterized by the control circuit providing both the first FET and the second FET with a disable control signal.

In some embodiments of the bi-directional switch, the control circuit is a voltage, a resistor divider or a voltage transformer.

In some embodiments, the bi-directional switch further comprises a firing angle reference generator, wherein the firing angle reference generator is configurable to generate a linear ramp down from a fixed starting angle.

In some embodiments of a method of controlling a bi-directional switch for an inductive machine, the method comprises initializing a first field effect transistor (FET) and a second FET, wherein the initializing comprises providing a first control signal, wherein the first control signal sets the first FET to an off state; and providing a second control signal, wherein the second control signal sets the second FET to an off state; determining a reference firing angle; comparing a measured phase angle to the reference firing angle; and controlling, based on the comparing, the first FET or the second FET into one of a plurality of modes.

In some embodiments of the method, the plurality of modes comprises a first mode, wherein the first mode provides bi-directional conduction of current; a second mode, wherein the second mode provides uni-directional conduction of current in a first direction; a third mode, wherein the third mode that provides uni-directional conduction of current in a second direction; and a fourth mode, wherein the fourth mode provides bi-directional blocking of conduction of current.

In some embodiments of the method, the plurality of modes further comprises the first mode characterized by providing both the first FET and the second FET with an enable control signal; the second mode characterized by providing the first FET with an enable control signal and providing the second FET with a disable control signal; a third mode characterized by providing the first FET with a disable control signal and providing the second FET with an enable control signal; and a fourth mode characterized by providing both the first FET and the second FET with a disable control signal.

In some embodiments, the method further comprises detecting a falling edge of a turn-on pulse generated by comparing a measured phase angle to the reference firing angle; and determining a number of return path devices in one or more other phases, wherein the number of return path devices is based on a state of each return path device of the return path devices.

In some embodiments, the method further comprises a measured phase current with a diode threshold current, wherein the comparing comprises determining a slope of the measured phase current.

In some embodiments of the method, the comparing comprises performing the comparing of the measured phase angle with the reference firing angle for each half cycle of a supply voltage.

In some embodiments of a system for performing soft turn-off of an inductive machine, the system comprises a soft-starter device comprising a first field effect transistor (FET), wherein the first FET includes a first source, a first drain, and a first gate; a second FET, wherein the second FET includes a second source, a second drain, and a second gate, wherein the second source is connected to the first source; and a control circuit configurable to provide a first control signal to the first FET and a second control signal to the second FET. In other embodiments, the FET can be configured using an insulated-gate bipolar transistor (IGBT) with a common drain, common collector, or common emitter.

In some embodiments of the system, the control circuit is configured to provide the first control signal and the second control signal such that the first FET and the second FET provide a plurality of modes of operation.

In some embodiments of the system, the plurality of modes comprises a first mode, wherein the first mode provides bi-directional conduction of current; a second mode, wherein the second mode provides uni-directional conduction of current in a first direction; a third mode, wherein the third mode that provides uni-directional conduction of current in a second direction; and a fourth mode, wherein the fourth mode provides bi-directional blocking of conduction of current.

In some embodiments of the system, the plurality of modes further comprises the first mode characterized by the control circuit providing both the first FET and the second FET with an enable control signal; the second mode characterized by the control circuit providing the first FET with an enable control signal and providing the second FET with a disable control signal; a third mode characterized by the control circuit providing the first FET with a disable control signal and providing the second FET with an enable control signal; and a fourth mode characterized by the control circuit providing both the first FET and the second FET with a disable control signal.

In some embodiments of the system, the control circuit is a resistor divider or a voltage transformer.

In some embodiments, the system further comprises a firing angle reference generator, wherein the firing angle reference generator is configurable to generate a linear ramp down from a fixed starting angle.

In some embodiments of the system, the control circuit is further configurable to perform operations including comparing a measured phase current with a diode threshold current; and determining a slope of the measured phase current.

In some embodiments of the system, the control circuit is further configurable to perform the comparing of the measured phase current with the reference firing angle for each half cycle of a supply voltage.

BRIEF DESCRIPTION OF THE DRAWINGS

References are made to the accompanying drawings that form a part of this disclosure and that illustrate embodiments in which the systems and methods described in this Specification can be practiced.

Like reference numbers may represent the same or similar parts throughout.

DETAILED DESCRIPTION

In the field of induction motors and highly inductive loads, performing a turn-off operation presents challenges because even very small current levels, such as less than 10 Amps, can cause excessive voltage across the soft-starter that exceeds the safe operating range and may damage or destroy the device or components thereof. Additionally, the motor winding may experience a corresponding over-voltage which increases stress on the winding insulation and other motor components. A soft-starter device as described herein reduces the starting current to adequate levels to avoid perturbations to the grid or to the motor starting process, by limiting the current conduction time. In addition, eliminates the over-voltages enabling greater reliability for the control circuit and the motor.

The soft-starter device may be implemented by using fully controllable power semiconductor devices (e.g. SiC MOSFETs), specifically for one or more source-to-source (or emitter-to-emitter) series connection of MOSFETs to form a bi-directional switch. The soft-starter device includes a control circuit and decision algorithm for operating the fully controllable power semiconductor devices to control the bi-directional switch to enable zero-current turn-off based on independently controlled states of the semiconductor devices and without need for accurate current sensing.

In a non-limiting example, the control circuit and decision algorithm enable control of source voltage applied to a three-phase load (e.g. motor load fed by a soft-starter) using fully controllable power semiconductor devices and extend the number of operations (e.g., tens of millions of operations) of the FET/IGBT based control switch and MOV due to a reduction in the stress under normal operations. The reduction of stress may also be realized by the motor winding insulation during the starting of direct on line/soft-started motors. The soft-starter device disclosed enables use of fully controllable semiconductor devices, such as SiC MOSFETs and GaN FET, which enable low losses and small form factor for solid state breaker, contactor, and Breaktor (i.e., breaker+contactor), and other event switching applications.

Figure 1A:
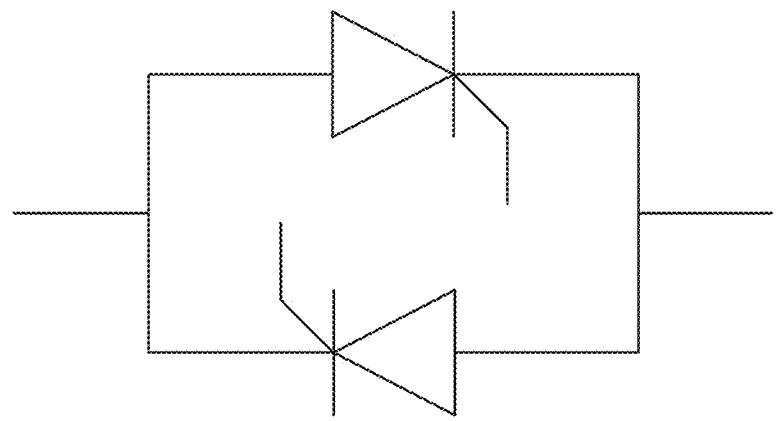
FIG. 1A depicts a soft-starter for an induction machine using a thyristor control switch.

Referring now to the figures, FIG. 1A depicts a soft-starter for an induction machine using a thyristor control switch. The device is gated with a pulsed current at certain firing angles in the supply voltage half-cycle. The device then naturally turns-off at the next current zero-crossing in the absence of a gate-pulse. The firing angle is varied throughout the soft-start duration based on a defined control strategy to limit the starting current of the motor. However, this uncontrolled turn-off of the thyristor cannot be used to limit the fault current in case of a downstream fault.

Figure 1B:
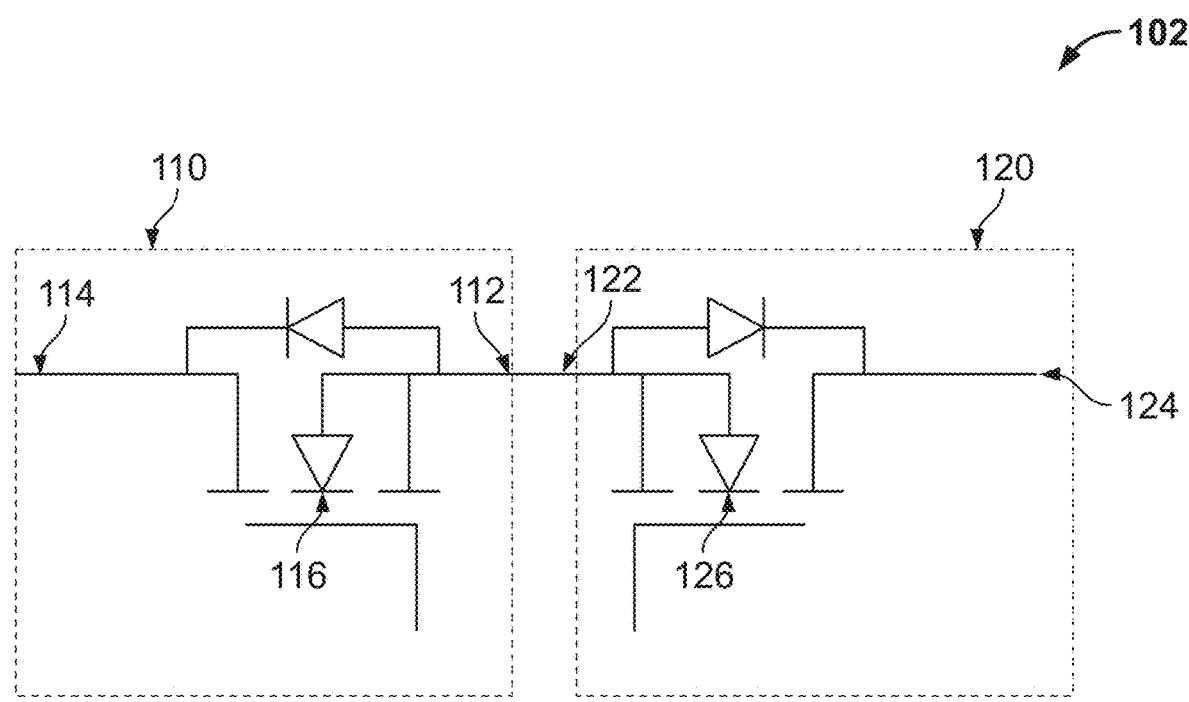
FIG. 1B depicts a fully controlled soft-starter device ("soft-starter device"), according to aspects of the present disclosure.

FIG. 1B depicts a fully controlled soft-starter device ("soft-starter device"), according to aspects of the present disclosure. For instance, the fully controlled soft-starter device may be a field effect transistor, such as a metal-oxide-semiconductor silicon carbide field effect transistor (SiC MOSFET). The SiC MOSFET may be utilized to combine a motor control function and a fault protection function for a motor controller/starter.

As shown in FIG. 1B, the fully controlled soft-starter device provides fast interruption of fault current that reduces the need for additional protection devices between the soft-starter device and the load. The fully controlled soft-starter device also provides frequent start and stop of the motor or frequent on/off control of general loads.

Since an induction motor is a highly inductive load, performing a turn-off operation at even very small current levels can cause the voltage across the soft-starter device to exceed the safe operating range. The motor winding may also experience a corresponding over-voltage which causes increased stress on the winding insulation. The accuracy of this zero-current turn-off (ZCTO) operation depends on the accuracy of a current sensor and the control electronics in the circuit. In some cases, the range of the current sensor can be high when the current sensor also controls the starting current. The current sensor used to also control the starting current generally have a low sensitivity and hence, reduced accuracy at low currents near the zero-crossing.

Other examples of soft-starter devices may include Insulated Gate Bipolar Transistors (IGBTs), junction-gate field-effect transistor (JFET), or gallium nitride (GaN) FETs.

As illustrated in FIG. 1B, the soft-starter device 102 includes a first field effect transistor (FET) 110 and a second FET 120. The first FET 110 includes a first source 112, a first drain 114, and a first gate 116. The soft-starter device 102 also includes a second FET 120. The second FET 120 includes a second source 122, a second drain 124, and a second gate 126.

While not pictured in FIG. 1B and as described elsewhere herein, the soft-starter device 102 may include a control circuit configured to provide independent control of the first FET 110 and second FET 120. The control circuit provides independent control signals to each of first FET 110 and second FET 120 to permit conduction of current alternatively through the diodes of the soft-starter device 102. Alternative commutation to the diodes of the soft-starter device 102 stops the conduction at the diode current inversion (zero-crossing). Controlling conduction based on the diode current inversion provides for reliable operation of both the soft-starter device 102 and a metal oxide varistor (MOV).

Figure 2:
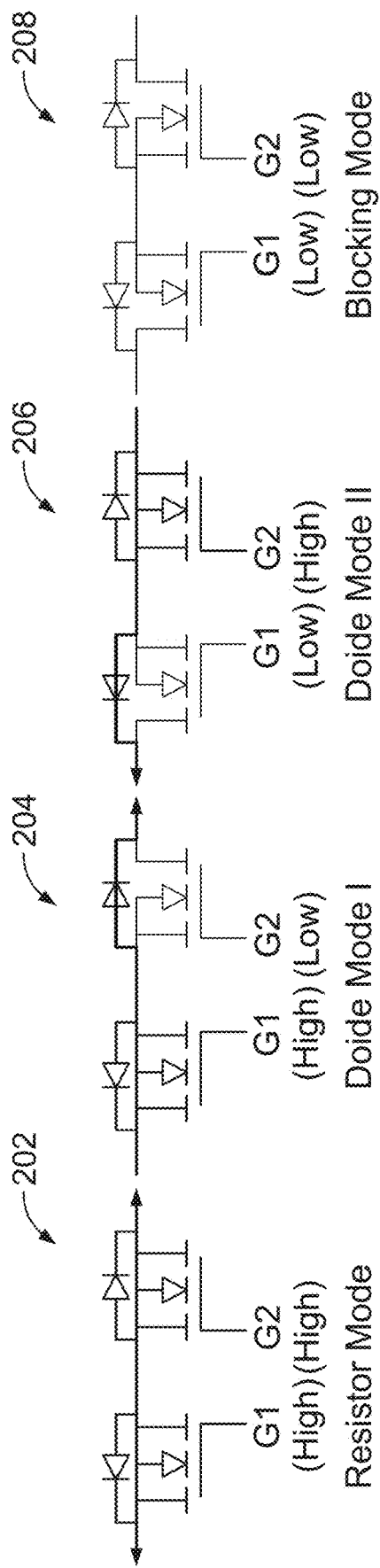
FIG. 2 depicts an example of various operating modes for the soft-starter device, according to aspects of the present disclosure.

FIG. 2 depicts an example of various operating modes for the soft-starter device, according to aspects of the present disclosure. The soft-starter device includes a control circuit for a back-to-back FET (e.g. SiC MOSFET) 4-quadrant switch configuration. The back-to-back FET configuration provides soft turn-off for solid state circuit breaker, contactors, and plug and play motor controllers. As described with regard to FIG. 1B, the back-to-back FET configuration provides current interruption while the current is reversing at the instant when it is actually zero (i.e., the zero crossing and diode current inversion).

The soft-starter device controlling the FETs based using the diode current inversion prevents both dangerous over-voltages across the soft-starter device (e.g., the component semiconductors) and excessive energy dissipation by the auxiliary components that clamp the voltage in case of overvoltage (e.g., MOV in parallel connection with the semiconductors).

The soft-starter device can selectively turn off, using a control circuit, one or more FET to commute the current to a freewheeling diode (e.g. body diode or the FET). Because the soft-starter device commutates the current to one or more freewheeling diodes, the current flow is not abruptly interrupted, but rather carried until the natural current inversion. After the current carried by one or mode diodes is exhausted by diode reverse recovery, the other FET or FETs may be turned off by the soft-starter device (e.g., using the control circuit). The soft-starter device turning off the other FET or FETs causes a complete current interruption and circuit isolation. Additional details of operations modes for the soft-starter device are described below.

In case of the two modes marked as diode modes in FIG. 2, one of the two semiconductor devices is gated low. Hence, the conduction is through the anti-parallel diode, making these uni-directional conduction modes. In the diode modes, the conduction will naturally stop at zero-current at the natural current inversion typical of an AC system. Hence, these modes can be used to achieve the desired natural zero current turn-off during the soft-start operation.

A first mode 202 provides for current conduction in both directions. For example, both the FETs (G1 and G2) are gated high. Thus, the channel of both devices are conducting and the soft-starter device behaves like a resistor, allowing conduction in both directions.

A second mode 204 and third mode 206 provide current conduction in one direction as depicted by the current flow through the respective diode for each mode. For example, in the second mode 204 one of the two FETs (G1 or G2) is gated low (and the opposite FET gated low for third mode 206). The current is conducted through the anti-parallel diode, making the second mode 204 and third mode 206 one-direction conduction modes. In the second mode 204 and third mode 206, the conduction will naturally stop at zero-current at the natural current inversion similar to an AC system. Hence, the second mode 204 and third mode 206 can be used to achieve the desired natural zero current turn-off during the soft-start operation and reduces the need for high accuracy current sensors.

A fourth mode 208, the soft-starter device blocks current conduction in both directions. For example, both the FETs (G1 and G2) are gated low. Thus, the channel of both devices are blocking and the soft-starter device behaves like an open circuit, preventing conduction in both directions.

Figure 3:
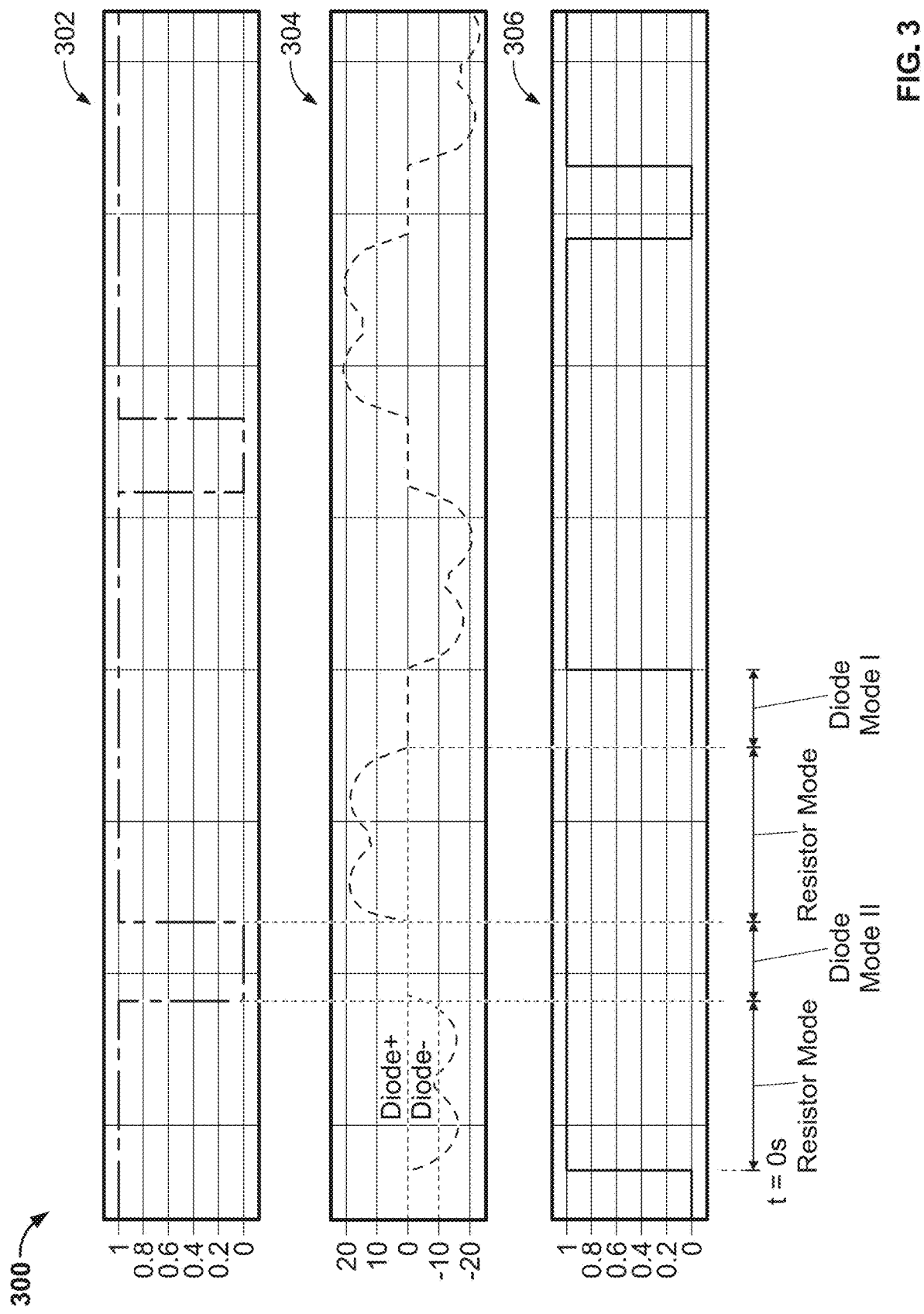
FIG. 3 depicts an example of timing diagrams using diode modes, according to aspects of the present disclosure.

FIG. 3 depicts an example of timing diagrams using diode modes, according to aspects of the present disclosure. For example, the chart 300 illustrates timing diagrams of a pulse 302 for a first FET, a pulse 306 for a second FET, and a phase current 304.

Figure 4:
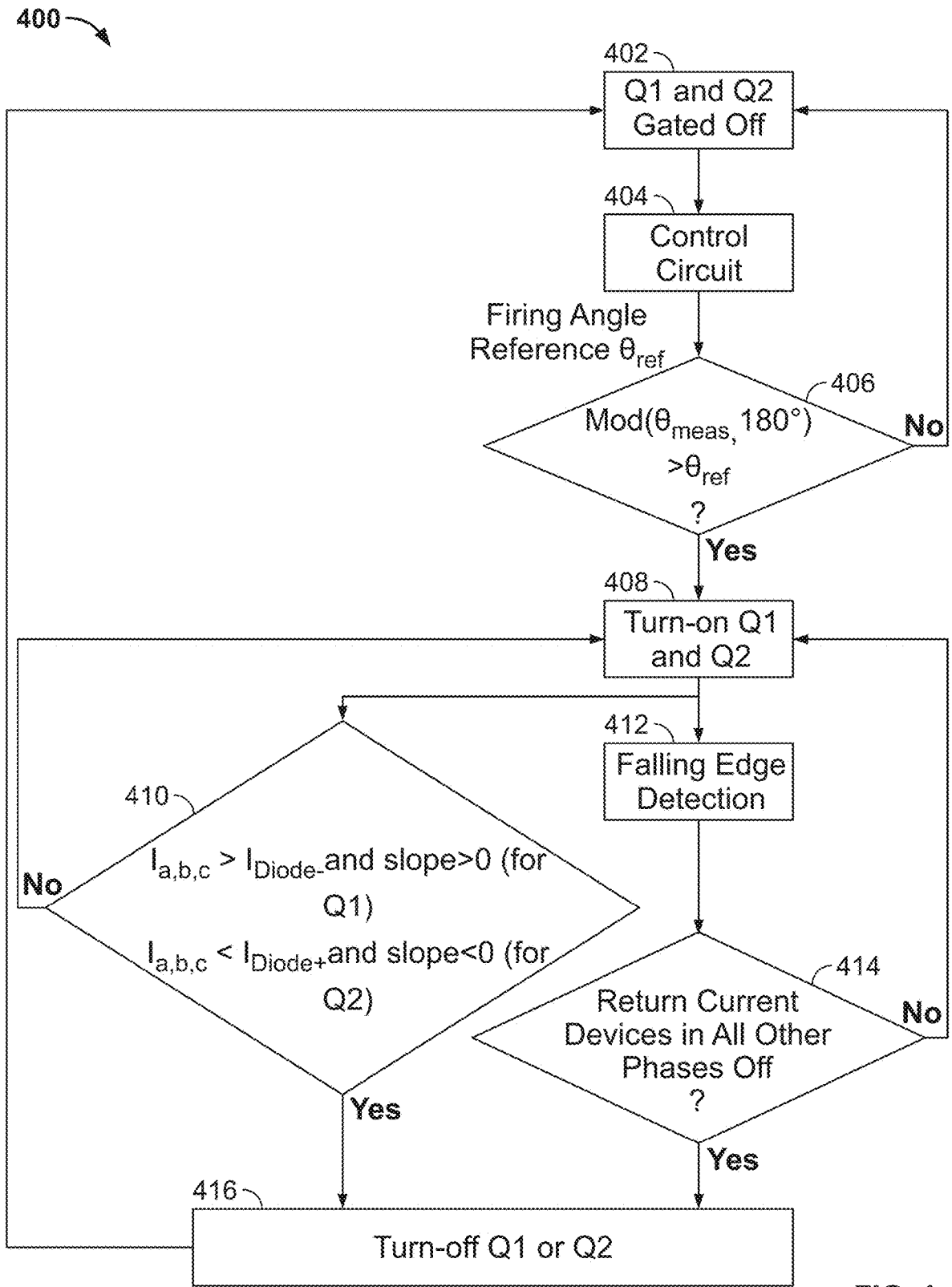
FIG. 4 depicts an example of a process for controlling a soft-starter device, according to some aspects of the present disclosure.

FIG. 4 depicts an example of a process for controlling a soft-starter device, according to some aspects of the present disclosure. In this example process, the soft-starter device includes two field effect transistors Q1 and Q2 and a control circuit. In one example, Q1 and Q2 may transistors as described with regards to FIGS. 1-3.

At block 402, the process 400 involves gating off both field effect transistors Q1 and Q2. For example, the control circuit can provide a low signal to the gate of each of Q1 and Q2. In one aspect, the operations at block 402 involve initializing the field effect transistors Q1 and Q2.

At block 404, the process 400 involves determining a reference firing angle to compare with the measured phase angle. In one example, the control circuit may set the reference firing angle to a pre-determined amount, or adjust the reference firing angle based on environmental, performance, and circuit characteristics (e.g., tolerances, motor specification, etc.).

At block 406, the process 400 involves comparing the measured phase of a supply voltage with the reference firing angle. In one example, the soft-starter device may perform a modulo operation of the measured phase angle with respect to 180° may be used. The soft-starter device may perform the comparison of the measured phase angle with the reference firing angle for each half cycle of the supply voltage. In another example, the soft-starter device may compare the measured phase with the reference firing angle as a binary comparison, or by computing a difference and determining the absolute value.

At block 408, the process 400 involves turning on the first FET Q1 and the second FET Q2. As described previously, both Q1 and Q2 enabled puts the soft-starter in the first mode and the soft-starter device provides current conduction in both directions. For example, both the FETs (G1 and G2) are gated high. Thus, the channel of both Q1 and Q2 are conducting and the soft-starter device behaves like a resistor, allowing conduction in both directions. From block 408, the process 400 proceeds in parallel to blocks 410 and 412.

At block 412, the soft-starter device may detect a falling edge of the turn-on pulse generated by a phase comparison. For instance, the soft-starter device may detect that the turn-on pulse generated at block 408 is transitioning from a high logic value to a low logic value. When the soft-starter device detects a falling edge, then the process 400 may move to block 414.

At block 414, the soft-starter device may determine whether any return-path devices in other phases are in an on state. For example in a three phase motor circuit, the soft-starter device may determine whether to turn off a Q1 device in Phase A will be dependent on whether the Q2 devices in Phases B and C are being provided an enabling control signal (gate on signal). As described with respect to block 412, the check of return-path devices is performed when a falling edge is detected.

In one example for three-phase loads without a neutral connection, determining whether any return-path devices are in an on state is necessary because the current cannot start flowing unless the devices in at least two phases are not turned-on. During a motor soft-start operation, the check of return-path devices can happen in the beginning of the soft-start period, when the firing angle is high. In this example, if only the turn-off condition based on current is used, the devices in the first phase will be kept in ON-state till the next half-cycle when a second phase control switch is turned-on.

For instance, when the reference angle is 150°, the semiconductor devices in the second phase will not turn-on till the first phase has reached 30° in the next half cycle. Controlling the semiconductor devices in the first phase in an ON-state until 30° in the next half cycle will cause high inrush currents. The high inrush currents may be observed when firing angles are higher than 120°. To compensate, the soft-starter device detects the state of the semiconductor devices in the other phases allowing the soft-starter device to turn off the semiconductor devices in the other phases at the end of the half cycle for high firing angles. In another example, for firing angles less than 120°, this turn-off condition will not be met. From block 414, the process 400 may proceed to block 416.

At block 410, the soft-starter device may compare the phase current with a diode threshold current (e.g., IDiode− and IDiode+). The soft-starter device may apply a comparison condition that is different for the FETs Q1 and Q2 in each phase. In the example depicted in FIG. 4, the comparison condition for Q1 may be $I_{a,b,c} > I_{Diode-}$ and a slope greater than 0 and the comparison for Q2 may be $I_{a,b,c} < I_{Diode+}$ and a slope less than 0. The soft-starter device may use the added condition on the slope to ensure that the turn-off determination is made only at the end of each current half-cycle. From block 410, the process 400 may proceed to block 416.

At block 416, the soft-starter device may determine to turn off Q1 or Q2 based on either or both of the conditions analyzed in block 410 and blocks 412-414. In one example, the soft-starter device may send a disable (e.g., a logic low voltage) signal to turn off one of the field effect transistors Q1 or Q2.

Figure 5:
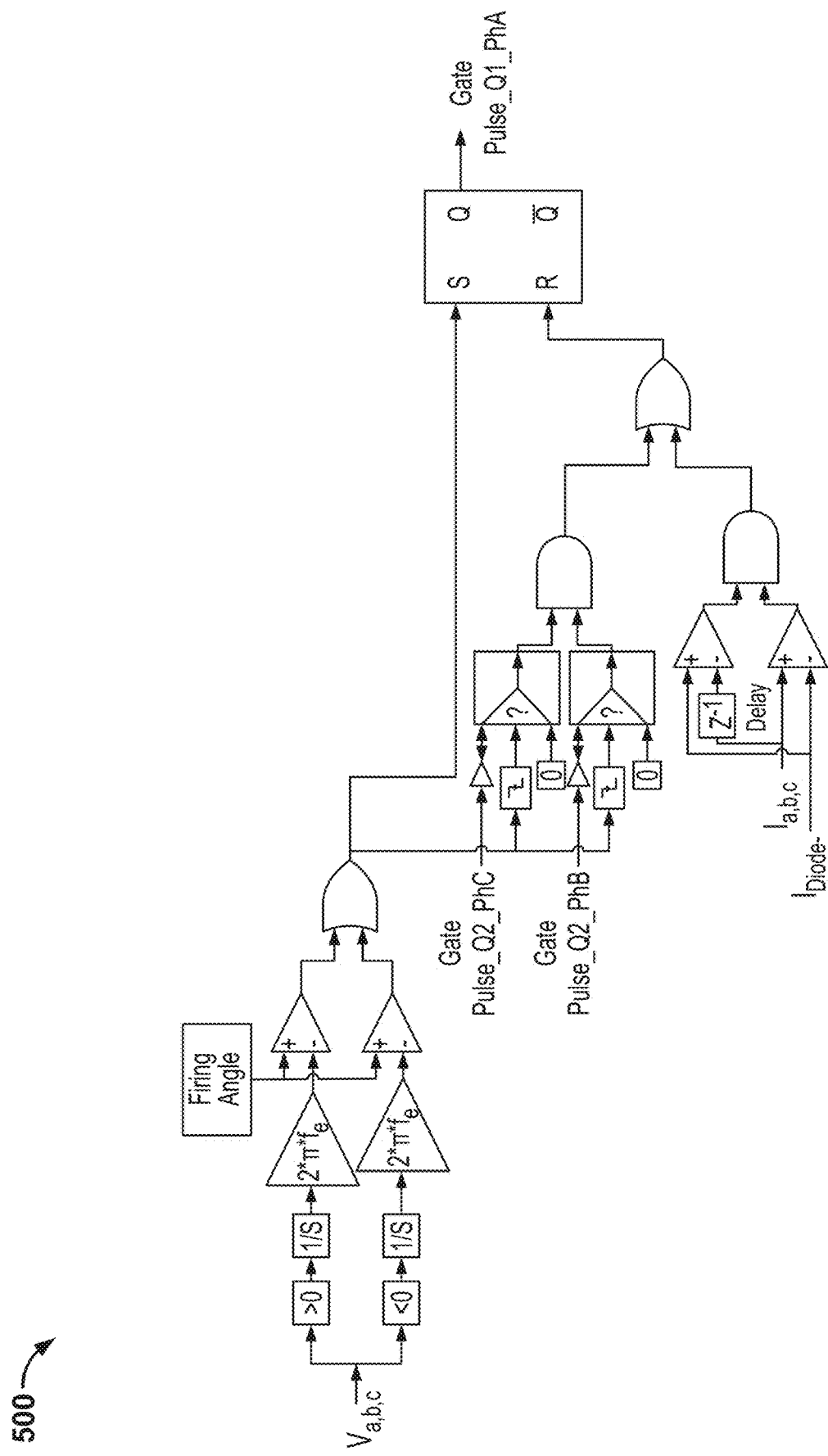
FIG. 5 depicts an example of a control circuit implementing the process of FIG. 4, according to some aspects of the present disclosure.

FIG. 5 depicts an example of a control circuit 500 implementing the process of FIG. 4, according to some aspects of the present disclosure. The operations performed by the control circuit 500 are described with regard to the operations performed in the various blocks of FIG. 4.

Figure 6:
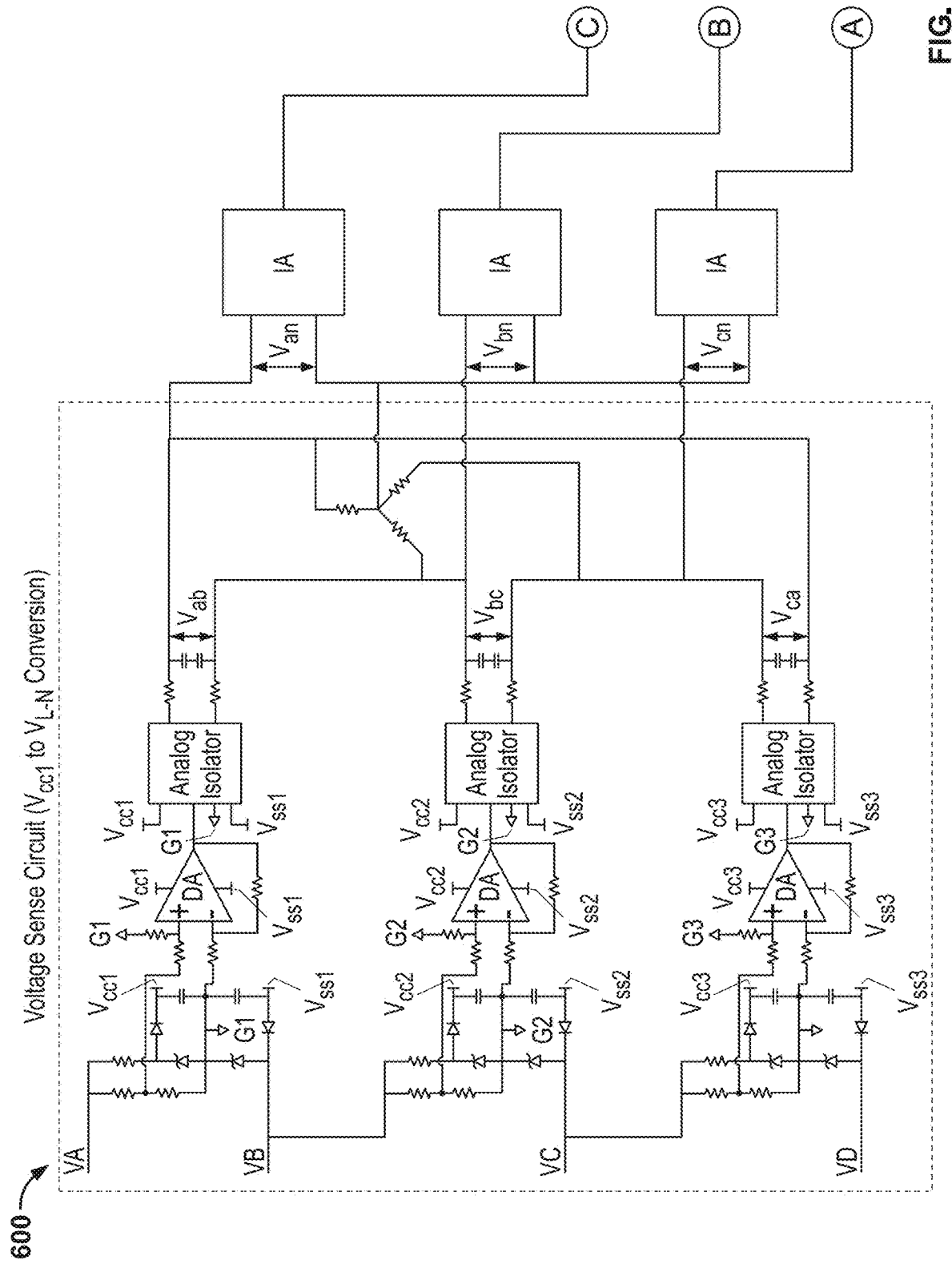
FIG. 6 depicts an example of a control circuit for soft turn-off using a resistor divider, according to some aspects of the present disclosure.

FIG. 6 depicts an example of a control circuit 600 for soft turn-off using a resistor divider, according to some aspects of the present disclosure. For instance, the voltage sense circuit of FIG. 6 implements a resistor divider and Zener diodes to generate bipolar supply voltages for the differential amplifier and the analog isolator. In this example, the fully differential output of the analog isolators is used to generate the neutral point voltage to sense the line to neutral voltage using an instrumentation amplifier.

Figure 7:
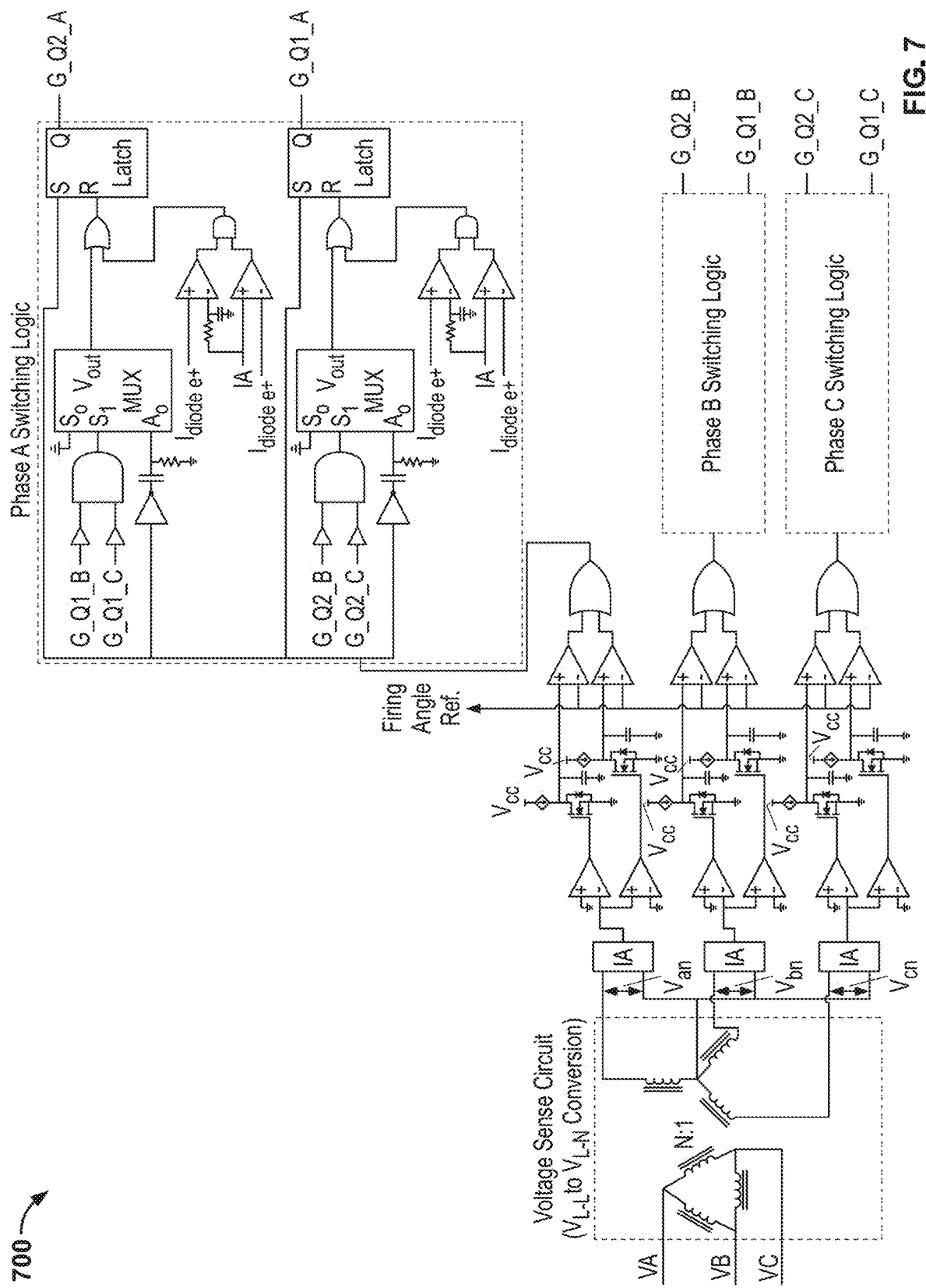
FIG. 7 depicts an example of a control circuit for soft turn-off using a voltage transformer, according to some aspects of the present disclosure.

FIG. 7 depicts an example of a control circuit 700 for soft turn-off using a voltage transformer, according to some aspects of the present disclosure. For instance, the voltage sense circuit may also be implemented using a delta to star 3-phase voltage transformer. In this example, because the turn-off decision for the one or more FETs is made based on measurements from the other phases, the measured voltages and currents for each of the phases may be used as a common control ground.

Figure 8:
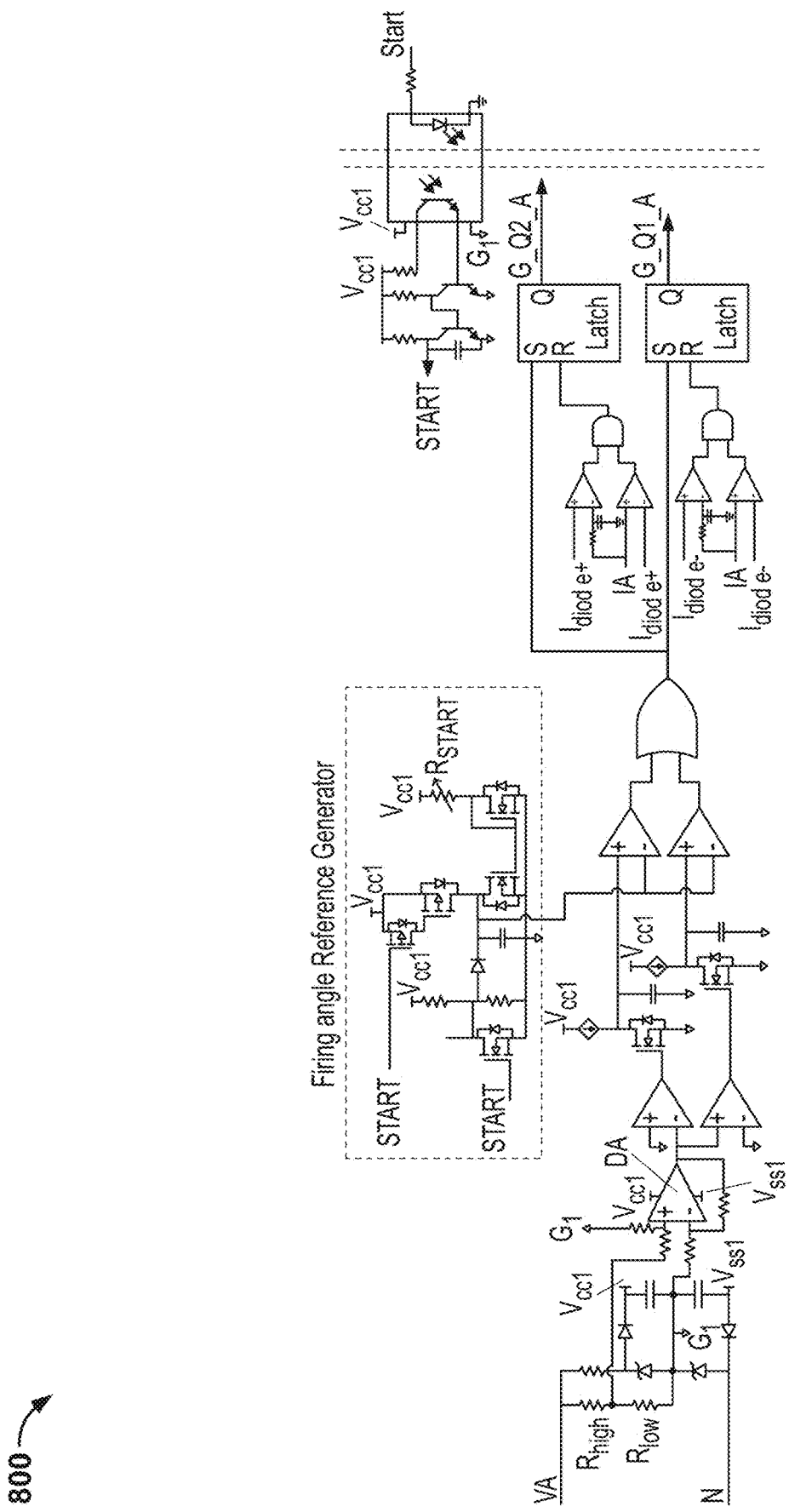
FIG. 8 depicts an example of a control circuit for soft turn-off for a three-phase, four-wire load, according to some aspects of the present disclosure.

FIG. 8 depicts an example of a control circuit 800 for soft turn-off for a three-phase, four-wire load, according to some aspects of the present disclosure. In this configuration, since a neutral connection is accessible, the measurement and analysis for each phase can be performed independently. Accordingly, the circuit shown in FIG. 8 is for one phase of the three-phase system. In this particular example, the control circuit includes a firing angle reference generator which generates a linear ramp down from a fixed starting angle. The firing angle reference generator may be used for open loop reduced voltage soft-starter type applications. This circuit can be modified based on the application requirements.

Figure 9:
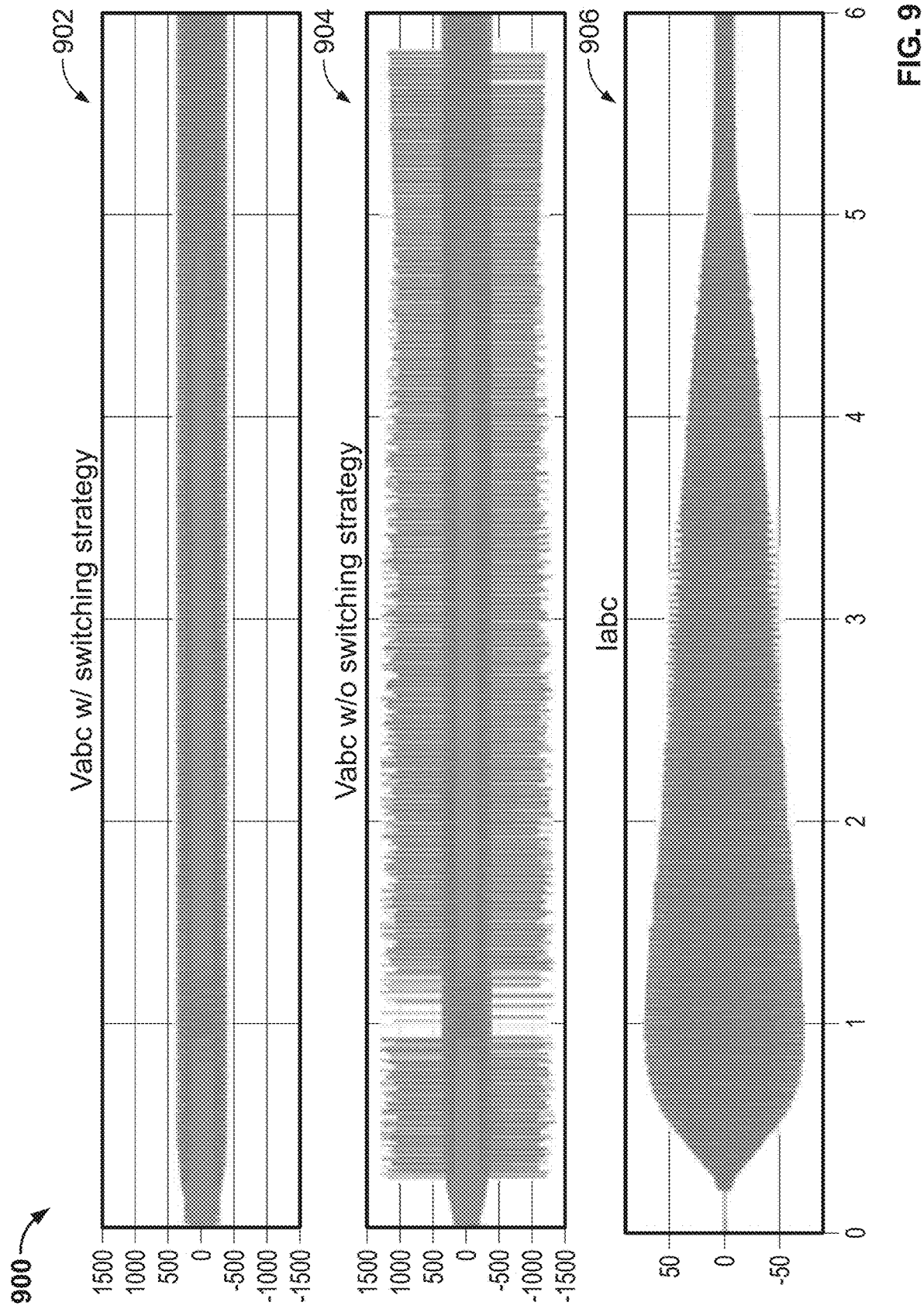
FIG. 9 depicts simulation results of a comparison of motor winding voltages with and without a control circuit for soft turn-off, according to some aspects of the present disclosure.

FIG. 9 depicts simulation results 900 of a comparison of motor winding voltages with and without a control circuit for soft turn-off, according to some aspects of the present disclosure. For instance, the simulation results 900 show a comparison of the voltage across the phase winding of the motor with and without the soft turn-off control circuit described herein. A first chart 902 shows the voltage using the soft-starter device as disclosed herein. A second chart 904 shows the voltage without implementing the soft-starter device as disclosed herein. A third chart 906 shows the current when using the soft-starter device as disclosed herein.

The first chart 902, second chart 904, and third chart 906 clearly illustrate that the motor phase windings experience significant over-voltages without the soft-starter device disclosed herein. Similar over-voltages can be observed across the control circuit which is in series with the phase windings. By implementing the soft-starter device disclosed herein, the over-voltages are eliminated causing greater reliability for the control circuit and the motor.

While various aspects of the invention has been illustrated and described in detail in the drawings and foregoing description, such illustration and description are to be considered illustrative or exemplary, and not restrictive. The invention is not limited to the disclosed embodiments.

Other variations to the disclosed embodiments can be understood, and effected by those skilled in the art in practicing the claimed invention, from a study of the drawings, the disclosure, and the dependent claims. It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

Aspects:

Various aspects are described below. Any of the following aspects or any portions thereof can be combined with any of the other aspects or any portions thereof.

Aspect 1. A bi-directional switch for an inductive machine, the bi-directional switch comprising:
  a first power semi-conductor transistor,
    wherein the first power semiconductor transistor includes a first source, a first drain, and a first gate;
  a second power semiconductor transistor,
    wherein the second power semiconductor transistor includes a second source, a second drain, and a second gate;
    wherein the second source is connected to the first source; and
  a soft-starter device including a control circuit configurable to provide a first control signal to the first power semiconductor transistor and a second control signal to the second power semiconductor transistor, wherein the soft-starter device is three-phase; and wherein the control circuit generates the first control signal and the second control signal are based on:
    detecting a falling edge of a turn-on pulse generated by comparing a measured phase angle to the reference firing angle;
    determining a number of return path devices in one or more other phases, wherein the number of return path devices is based on a state of each return path device of the return path devices; and
    comparing a measured phase current with a diode threshold current, wherein the comparing comprises determining a slope of the measured phase current.

Aspect 2. The bi-directional switch of aspect 1, wherein the control circuit is configured to provide the first control signal and the second control signal such that the first power semiconductor transistor and the second power semiconductor transistor provide a plurality of modes of operation.

Aspect 3. The bi-directional switch of any of aspects 1-2, wherein the plurality of modes comprises:
  a first mode,
    wherein the first mode provides bi-directional conduction of current;
  a second mode,
    wherein the second mode provides uni-directional conduction of current in a first direction;
  a third mode,
    wherein the third mode that provides uni-directional conduction of current in a second direction; and
  a fourth mode,
    wherein the fourth mode provides bi-directional blocking of conduction of current.

Aspect 4. The bi-directional switch of any of aspects 1-3, wherein the plurality of modes further comprises:
  the first mode characterized by the control circuit providing both the first power semiconductor transistor and the second power semiconductor transistor with an enable control signal;
  the second mode characterized by the control circuit providing the first power semiconductor transistor with an enable control signal and providing the second power semiconductor transistor with a disable control signal;
  a third mode characterized by the control circuit providing the first power semiconductor transistor with a disable control signal and providing the second power semiconductor transistor with an enable control signal; and
  a fourth mode characterized by the control circuit providing both the first power semiconductor transistor and the second power semiconductor transistor with a disable control signal.

Aspect 5. The bi-directional switch of any of aspects 1-4, wherein the control circuit is a voltage, a resistor divider or a voltage transformer.

Aspect 6. The bi-directional switch of any of aspects 1-5, further comprising: a firing angle reference generator,
  wherein the firing angle reference generator is configurable to generate a linear ramp down from a fixed starting angle.

Aspect 7. A method of controlling a bi-directional switch for an inductive machine, the method comprising:
  initializing a first power semiconductor transistor and a second power semiconductor transistor, wherein the initializing comprises:
    providing a first control signal,
      wherein the first control signal sets the first power semiconductor transistor to an off state; and
    providing a second control signal.
      wherein the second control signal sets the second power semiconductor transistor to an off state;
  determining a reference firing angle;
  comparing a measured phase angle to the reference firing angle; and
  controlling, based on the comparing, the first power semiconductor transistor or the second power semiconductor transistor into one of a plurality of modes.

Aspect 8. The method of aspect 7, wherein the plurality of modes comprises:
  a first mode,
    wherein the first mode provides bi-directional conduction of current;
  a second mode,
    wherein the second mode provides uni-directional conduction of current in a first direction;
  a third mode,
    wherein the third mode that provides uni-directional conduction of current in a second direction: and
  a fourth mode,
    wherein the fourth mode provides bi-directional blocking of conduction of current.

Aspect 9. The method of any of aspects 7-8, wherein the plurality of modes further comprises:
  the first mode characterized by providing both the first power semiconductor transistor and the second power semiconductor transistor with an enable control signal;
  the second mode characterized by providing the first power semiconductor transistor with an enable control signal and providing the second power semiconductor transistor with a disable control signal;
  a third mode characterized by providing the first power semiconductor transistor with a disable control signal and providing the second power semiconductor transistor with an enable control signal; and
  a fourth mode characterized by providing both the first power semiconductor transistor and the second power semiconductor transistor with a disable control signal.

Aspect 10. The method of any of aspects 7-9, further comprising:
  detecting a falling edge of a turn-on pulse generated by comparing a measured phase angle to the reference firing angle; and
  determining a number of return path devices in one or more other phases, wherein the number of return path devices is based on a state of each return path device of the return path devices.

Aspect 11. The method of any of aspects 7-10, further comprising comparing a measured phase current with a diode threshold current, wherein the comparing comprises determining a slope of the measured phase current.

Aspect 12. The method of any of aspects 7-11, wherein the comparing comprises performing the comparing of the measured phase angle with the reference firing angle for each half cycle of a supply voltage.

Aspect 13. A system for performing soft turn-off of an inductive machine, the system comprising:
  a soft-starter device comprising:
  a first power semiconductor transistor,
    wherein the first power semiconductor transistor includes a first source, a first drain, and a first gate;
  a second power semiconductor transistor,
    wherein the second power semiconductor transistor includes a second source, a second drain, and a second gate,
    wherein the second source is connected to the first source; and
  a control circuit configurable to provide a first control signal to the first power semiconductor transistor and a second control signal to the second power semiconductor transistor.

Aspect 14. The system of aspect 13, wherein the control circuit is configured to provide the first control signal and the second control signal such that the first power semiconductor transistor and the second power semiconductor transistor provide a plurality of modes of operation.

Aspect 15. The system of any of aspects 13-14, wherein the plurality of modes comprises:
  a first mode,
    wherein the first mode provides bi-directional conduction of current;
  a second mode,
    wherein the second mode provides uni-directional conduction of current in a first direction;
  a third mode,
    wherein the third mode that provides uni-directional conduction of current in a second direction: and
  a fourth mode,
    wherein the fourth mode provides bi-directional blocking of conduction of current.

Aspect 16. The system of any of aspects 13-15, wherein the plurality of modes further comprises:
  the first mode characterized by the control circuit providing both the first power semiconductor transistor and the second power semiconductor transistor with an enable control signal;
  the second mode characterized by the control circuit providing the first power semiconductor transistor with an enable control signal and providing the second power semiconductor transistor with a disable control signal;
  a third mode characterized by the control circuit providing the first power semiconductor transistor with a disable control signal and providing the second power semiconductor transistor with an enable control signal; and
  a fourth mode characterized by the control circuit providing both the first power semiconductor transistor and the second power semiconductor transistor with a disable control signal.

Aspect 17. The system of any of aspects 13-16, wherein the control circuit is a resistor divider or a voltage transformer.

Aspect 18. The system of any of aspects 13-17, further comprising:
  a firing angle reference generator,
    wherein the firing angle reference generator is configurable to generate a linear ramp down from a fixed starting angle.

Aspect 19. The system of any of aspects 13-18, wherein the control circuit is further configurable to perform operations including:
  comparing a measured phase current with a diode threshold current; and
  determining a slope of the measured phase current.

Aspect 20. The system of any of aspects 13-19, wherein the control circuit is further configurable to perform the comparing of the measured phase current with the reference firing angle for each half cycle of a supply voltage.

The terminology used herein is intended to describe embodiments and is not intended to be limiting. The terms "a," "an," and "the" include the plural forms as well, unless clearly indicated otherwise. The terms "comprises" and/or "comprising," when used in this Specification, specify the presence of the stated features, integers, steps, operations, elements, and/or components, but do not preclude the presence or addition of one or more other features, integers, steps, operations, elements, and/or components.

What is claimed is:

1. A bi-directional switch for an inductive machine, the bi-directional switch comprising:
  a first power semiconductor transistor,
    wherein the first power semiconductor transistor includes a first source, a first drain, and a first gate;
  a second power semiconductor transistor,
    wherein the second power semiconductor transistor includes a second source, a second drain, and a second gate, and the second source is directly connected to the first source;
  a firing angle reference generator,
    wherein the firing angle reference generator is configured to generate a linear ramp down from a fixed starting angle; and
  a soft-starter device including a control circuit configured to provide a first control signal to the first power semiconductor transistor and a second control signal to the second power semiconductor transistor,
    wherein the soft-starter device is for a three-phase load; and
    wherein the control circuit generates the first control signal and the second control signal based on:
    detecting a falling edge of a turn-on pulse generated by comparing a measured phase angle to a reference firing angle for each half cycle of a supply voltage,
    determining a number of return path devices in one or more phases, wherein the number of return path devices is based on a state of each return path device of the return path devices, and
    comparing a measured phase current with a diode threshold current, wherein the comparing of the measured phase current with the diode threshold current comprises determining a slope of the measured phase current.

2. The bi-directional switch of claim 1, wherein the control circuit is configured to provide the first control signal and the second control signal such that the first power semiconductor transistor and the second power semiconductor transistor provide a plurality of modes of operation.

3. The bi-directional switch of claim 2, wherein the plurality of modes of operation comprises:
a first mode,
wherein the first mode provides bi-directional conduction of current;
a second mode,
wherein the second mode provides uni-directional conduction of current in a first direction;
a third mode,
wherein the third mode that provides uni-directional conduction of current in a second direction; and
a fourth mode,
wherein the fourth mode provides bi-directional blocking of conduction of current.

4. The bi-directional switch of claim 3, wherein the plurality of modes of operation further comprises:
the first mode characterized by the control circuit providing both the first power semiconductor transistor and the second power semiconductor transistor with an enable control signal, respectively;
the second mode characterized by the control circuit providing the first power semiconductor transistor with the enable control signal and providing the second power semiconductor transistor with a disable control signal;
the third mode characterized by the control circuit providing the first power semiconductor transistor with the disable control signal and providing the second power semiconductor transistor with the enable control signal; and
the fourth mode characterized by the control circuit providing both the first power semiconductor transistor and the second power semiconductor transistor with the disable control signal, respectively.

5. The bi-directional switch of claim 1, wherein the control circuit comprises a resistor divider or a voltage transformer.

6. A method for controlling a bi-directional switch for an inductive machine, wherein the bi-directional switch comprises a first power semiconductor transistor, wherein the first power semiconductor transistor includes a first source; a second power semiconductor transistor, wherein the second power semiconductor transistor includes a second source; the second source being directly connected to the first source; a firing angle reference generator, wherein the firing angle reference generator is configured to generate a linear ramp down from a fixed starting angle; and a soft-starter device including a control circuit, wherein the soft-starter device is for a three-phase load, the method comprising:
initializing the first power semiconductor transistor and the second power semiconductor transistor,
wherein the initializing comprises:
providing a first control signal,
wherein the first control signal sets the first power semiconductor transistor to an on state or an off state; and
providing a second control signal,
wherein the second control signal sets the second power semiconductor transistor to an on state or an off state;
detecting a falling edge of a turn-on pulse generated by comparing a measured phase angle to a reference firing angle for each half cycle of a supply voltage;
determining a number of return path devices in one or more phases, wherein the number of return path devices is based on a state of each return path device of the return path devices; and
comparing a measured phase current with a diode threshold current, wherein the comparing of the measured phase current with the diode threshold current comprises determining a slope of the measured phase current.

7. The method of claim 6, wherein a plurality of modes of operation of the first power semiconductor transistor and the second power semiconductor transistor comprises:
a first mode,
wherein the first mode provides bi-directional conduction of current;
a second mode,
wherein the second mode provides uni-directional conduction of current in a first direction;
a third mode,
wherein the third mode that provides uni-directional conduction of current in a second direction; and
a fourth mode,
wherein the fourth mode provides bi-directional blocking of conduction of current.

8. The method of claim 7, wherein the plurality of modes of operation further comprises:
the first mode characterized by providing both the first power semiconductor transistor and the second power semiconductor transistor with an enable control signal, respectively;
the second mode characterized by providing the first power semiconductor transistor with the enable control signal and providing the second power semiconductor transistor with a disable control signal;
the third mode characterized by providing the first power semiconductor transistor with the disable control signal and providing the second power semiconductor transistor with the enable control signal; and
the fourth mode characterized by providing both the first power semiconductor transistor and the second power semiconductor transistor with the disable control signal, respectively.

9. A system for performing soft turn-off of an inductive machine, the system comprising:
a first power semiconductor transistor,
wherein the first power semiconductor transistor includes a first source, a first drain, and a first gate;
a second power semiconductor transistor,
wherein the second power semiconductor transistor includes a second source, a second drain, and a second gate, and the second source is directly connected to the first source;
a firing angle reference generator,
wherein the firing angle reference generator is configured to generate a linear ramp down from a fixed starting angle; and
a soft-starter device including a control circuit configured to provide a first control signal to the first power semiconductor transistor and a second control signal to the second power semiconductor transistor,
wherein the soft-starter device is for a three-phase load, and
wherein the control circuit generates the first control signal and the second control signal based on:

detecting a falling edge of a turn-on pulse generated by comparing a measured phase angle to a reference firing angle for each half cycle of a supply voltage, determining a number of return path devices in one or more phases, wherein the number of return path devices is based on a state of each return path device of the return path devices, and comparing a measured phase current with a diode threshold current, wherein the comparing of the measured phase current with the diode threshold current comprises determining a slope of the measured phase current.

10. The system of claim 9, wherein the control circuit is configured to provide the first control signal and the second control signal such that the first power semiconductor transistor and the second power semiconductor transistor provide a plurality of modes of operation.

11. The system of claim 10, wherein the plurality of modes of operation comprises:
a first mode,
wherein the first mode provides bi-directional conduction of current;
a second mode,
wherein the second mode provides uni-directional conduction of current in a first direction;
a third mode,
wherein the third mode that provides uni-directional conduction of current in a second direction; and
a fourth mode,
wherein the fourth mode provides bi-directional blocking of conduction of current.

12. The system of claim 11, wherein the plurality of modes of operation further comprises:
the first mode characterized by the control circuit providing both the first power semiconductor transistor and the second power semiconductor transistor with an enable control signal, respectively;
the second mode characterized by the control circuit providing the first power semiconductor transistor with the enable control signal and providing the second power semiconductor transistor with a disable control signal;
the third mode characterized by the control circuit providing the first power semiconductor transistor with the disable control signal and providing the second power semiconductor transistor with the enable control signal; and
the fourth mode characterized by the control circuit providing both the first power semiconductor transistor and the second power semiconductor transistor with the disable control signal, respectively.

13. The system of claim 9, wherein the control circuit comprises a resistor divider or a voltage transformer.

* * * * *